United States Patent
Miskovic

(10) Patent No.: US 11,903,321 B2
(45) Date of Patent: Feb. 13, 2024

(54) DEVICE FOR PRODUCING A NON-THERMAL ATMOSPHERIC PRESSURE PLASMA AND METHOD FOR OPERATING A PIEZOELECTRIC TRANSFORMER

(71) Applicant: TDK Electronics AG, Munich (DE)

(72) Inventor: Goran Miskovic, Deutschlandsberg (AT)

(73) Assignee: TDK Electronics AG, Munich (DE)

( * ) Notice: Subject to any disclaimer, the term of this patent is extended or adjusted under 35 U.S.C. 154(b) by 759 days.

(21) Appl. No.: 16/976,643

(22) PCT Filed: Mar. 12, 2019

(86) PCT No.: PCT/EP2019/056169
§ 371 (c)(1),
(2) Date: Aug. 28, 2020

(87) PCT Pub. No.: WO2019/175178
PCT Pub. Date: Sep. 19, 2019

(65) Prior Publication Data
US 2020/0411745 A1 Dec. 31, 2020

(30) Foreign Application Priority Data
Mar. 14, 2018 (DE) .......................... 102018105895.0

(51) Int. Cl.
*H05H 1/24* (2006.01)
*H10N 30/40* (2023.01)
*H10N 30/80* (2023.01)

(52) U.S. Cl.
CPC ........ *H10N 30/804* (2023.02); *H05H 1/2475* (2013.01); *H10N 30/40* (2023.02); *H05H 1/2481* (2021.05)

(58) Field of Classification Search
CPC ...... H05H 1/24; H05H 1/2475; H05H 1/2481; H05H 2240/20; H05B 41/2822;
(Continued)

(56) References Cited

U.S. PATENT DOCUMENTS 7,821,762 B2   10/2010 Yasuoka et al.
10,624,197 B2   4/2020 Weilguni et al.
(Continued)

FOREIGN PATENT DOCUMENTS

DE          19836561 A1    2/2000
DE       102008057423 A1    6/2009
(Continued)

OTHER PUBLICATIONS

Kenji, T., "Development of Plasma Reactors Based on Piezoelectric Transformer and Their Power Supply Toward Practical Uses," Report on Research Results of Grants-in-Aid for Scientific Research, Young Researchers (B), 2007-2008, Japan Society for the Promotion of Science, Research Project No. 19760204, May 1, 2009, 18 pages.
(Continued)

*Primary Examiner* — Thai Pham
(74) *Attorney, Agent, or Firm* — Slater Matsil, LLP

(57) ABSTRACT

A device for producing a non-thermal atmospheric pressure plasma and a method for operating a piezoelectric transformer are disclosed. In an embodiment a device includes a piezoelectric transformer, a driver circuit configured to apply an input signal to the piezoelectric transformer and a field probe configured to measure a field strength of an electric field produced by the piezoelectric transformer at a measurement point, wherein the driver circuit is configured to adapt the input signal while taking into account measure-
(Continued)

ment results of the field probe, and wherein the device is configured to produce a non-thermal atmospheric pressure plasma.

44 Claims, 6 Drawing Sheets

(58) Field of Classification Search
CPC ............ H05B 41/2827; H05B 41/2828; H05B 41/3925; H10N 30/40; H10N 30/804
See application file for complete search history.

(56) References Cited

U.S. PATENT DOCUMENTS

| 10,638,590 | B2 | 4/2020 | Weilguni et al. | |
|---|---|---|---|---|
| 10,772,182 | B2 | 9/2020 | Weilguni et al. | |
| 10,966,309 | B2* | 3/2021 | Pichler | H10N 30/40 |
| 2017/0232122 | A1* | 8/2017 | Hancock | A61L 2/14 604/23 |
| 2018/0249569 | A1* | 8/2018 | Weilguni | H10N 30/804 |
| 2019/0198746 | A1* | 6/2019 | Weilguni | H03F 3/2176 |
| 2020/0077502 | A1* | 3/2020 | Weilguni | H10N 30/40 |
| 2020/0137866 | A1* | 4/2020 | Nettesheim | H10N 30/20 |
| 2020/0187343 | A1 | 6/2020 | Weilguni et al. | |

FOREIGN PATENT DOCUMENTS

| DE | 102015112410 A1 | 2/2017 |
|---|---|---|
| DE | 102015113656 A1 | 2/2017 |
| DE | 102015119574 A1 | 5/2017 |
| DE | 102016104490 B3 | 5/2017 |
| DE | 102017105415 A1 | 9/2018 |
| EP | 2139302 A1 | 12/2009 |
| GB | 2459461 A | 10/2009 |
| JP | H11326592 A | 11/1999 |
| JP | 2010123269 A | 6/2010 |
| WO | 2017081272 A1 | 5/2017 |

OTHER PUBLICATIONS

H. Itoh, et al., "Discharge plasmas generated by piezoelectric transformers and their applications," Institute of Physics Publishing, Plasma Sources Sci. Technol. 15, Apr. 24, 2006, 11 pages.

K. Teranishi, et al., "Absolute Measurement of Surface Potential and Discharge Power Distributions for Piezoelectric Transformer-Based Plasma Reactor," Japanese Journal of Applied Physics, vol. 44, No. 9B, Sep. 22, 2005, 6 pages.

K. Teranishi, et al., "A Novel Generation Method of Dielectric Barrier Discharge and Ozone Production Using a Piezoelectric Transformer," Japanese Journal of Applied Physics, vol. 43, No. 9B, Sep. 22, 2004, 7 pages.

* cited by examiner

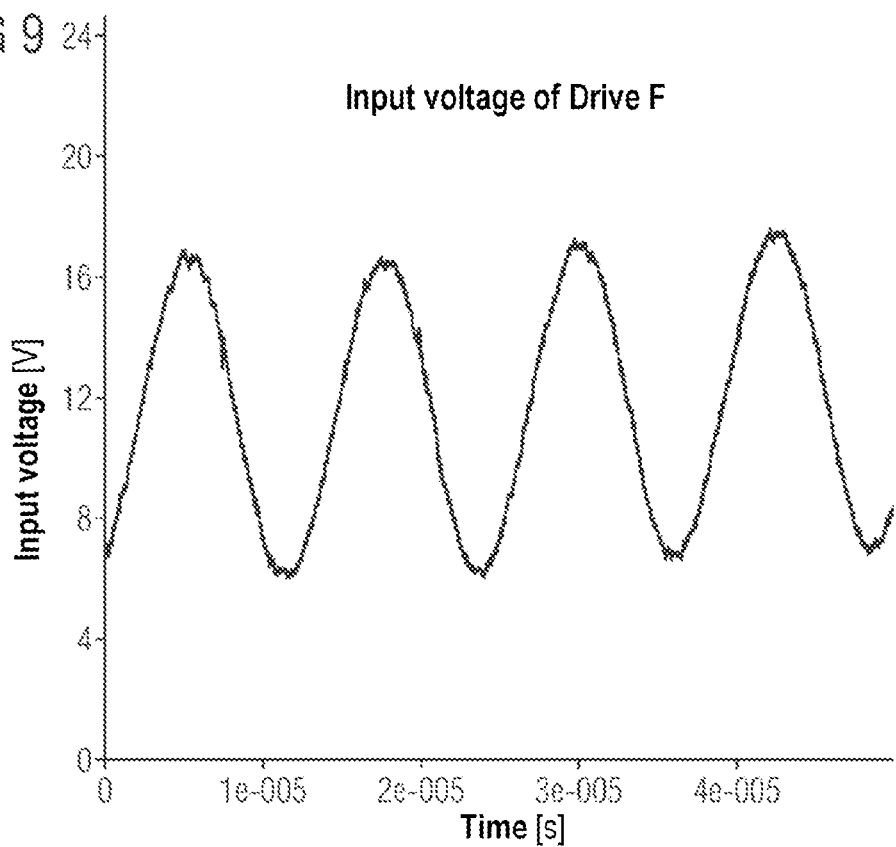
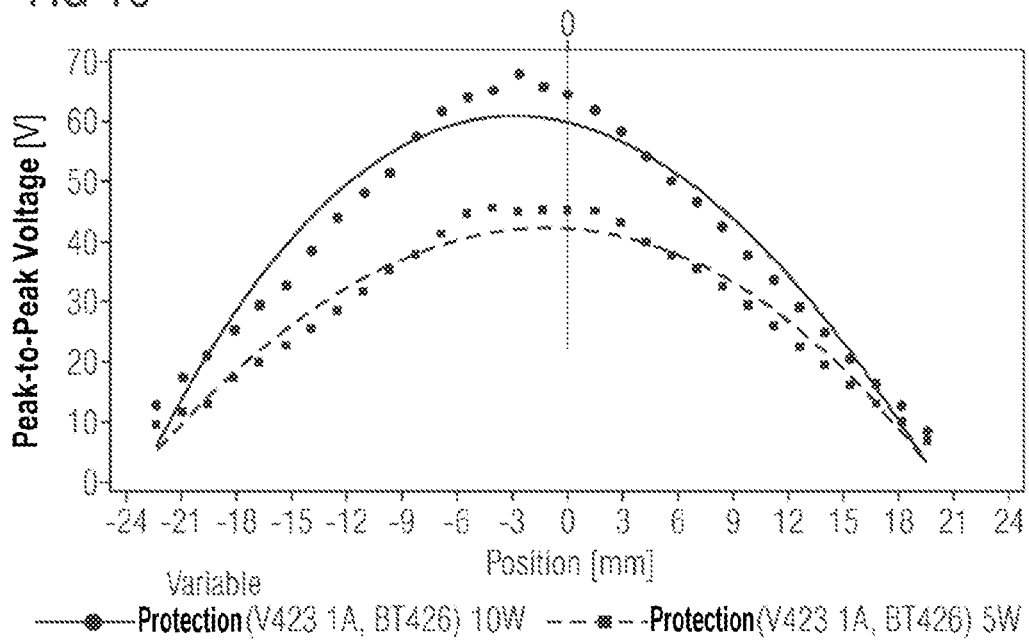

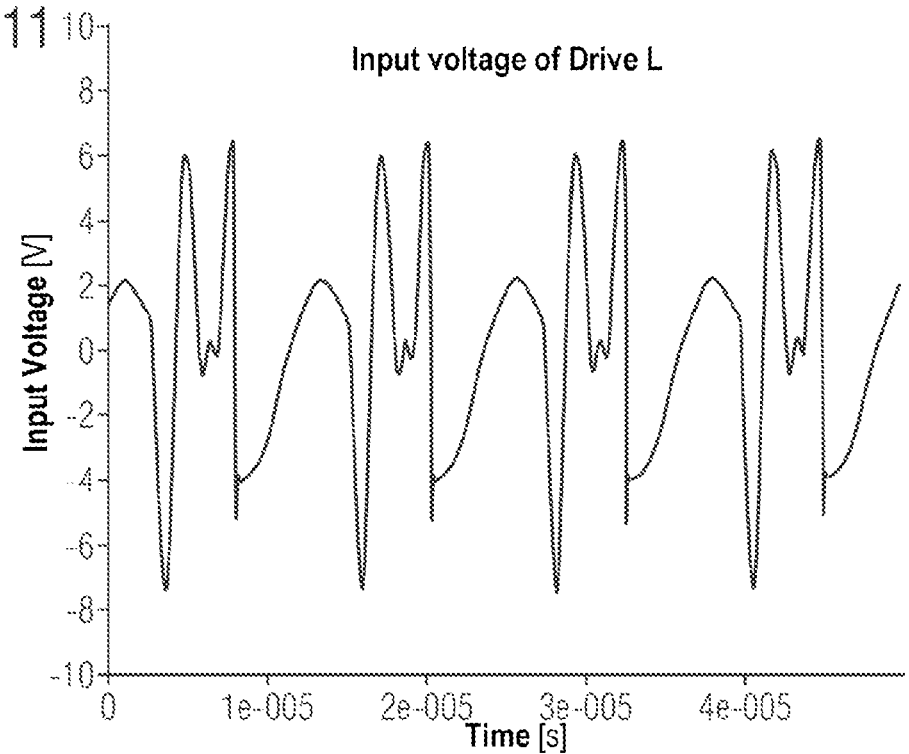
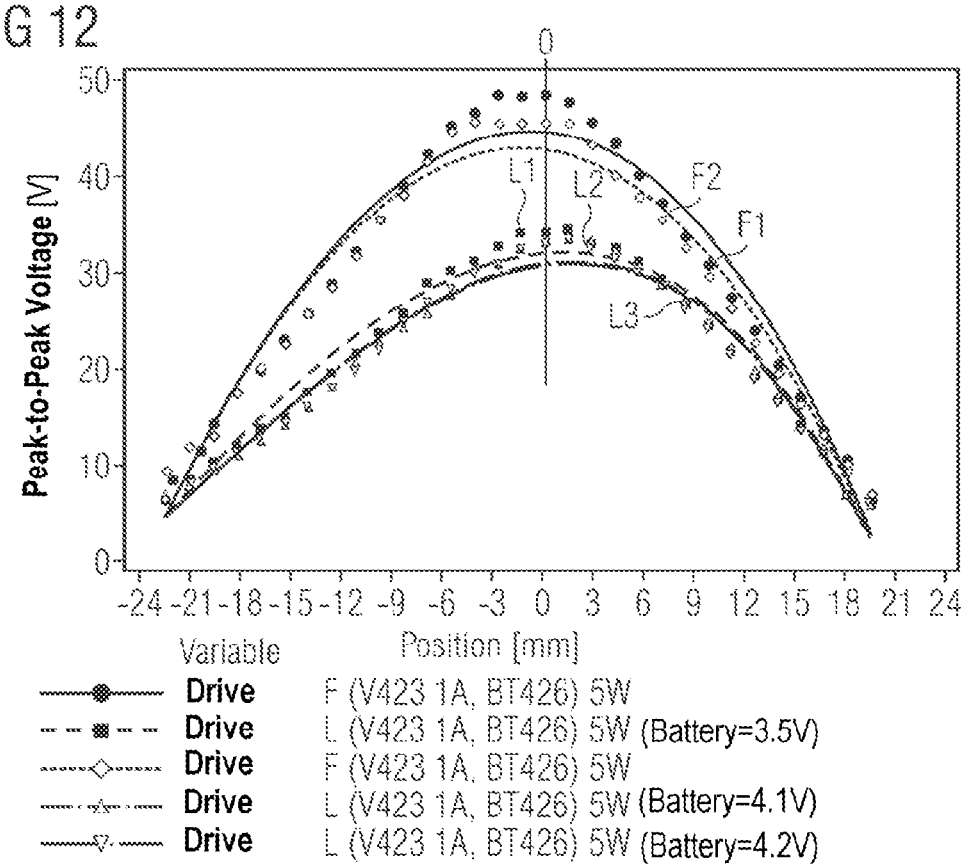

DEVICE FOR PRODUCING A NON-THERMAL ATMOSPHERIC PRESSURE PLASMA AND METHOD FOR OPERATING A PIEZOELECTRIC TRANSFORMER

This patent application is a national phase filing under section 371 of PCT/EP2019/056169, filed Mar. 12, 2019, which claims the priority of German patent application 102018105895.0, filed Mar. 14, 2018, each of which is incorporated herein by reference in its entirety.

TECHNICAL FIELD

The invention relates to a device for producing a non-thermal atmospheric pressure plasma and to a method for operating a piezoelectric transformer.

BACKGROUND

Piezoelectric transformers, in particular transformers of the Rosen type, may be used to produce plasma. During the production of plasma, a high efficiency is achieved when the piezoelectric transformer is driven with a frequency that corresponds to the series resonant frequency or the parallel resonant frequency of the transformer. However, the series resonant frequency and the parallel resonant frequency are not constant but depend on various parameters. If a plasma is ignited on an output end side of the transformer, it interacts as a load with the transformer and then influences the impedance of the transformer. In this way, a shift of the series resonance and of the parallel resonance takes place relative to operation of the transformer under no load, during which the applied voltage is not sufficient to ignite a plasma. The working environments, for example, the process gas used, the temperature of the transformer or the presence of additional or alternating external loads, also influence the series resonant frequency and the parallel resonant frequency. Furthermore, the input signal applied to the transformer may influence the series resonant frequency and the parallel resonant frequency.

SUMMARY OF THE INVENTION

It Embodiments provide an improved device for producing a non-thermal atmospheric pressure plasma. Further embodiments provide an improved method for operating a piezoelectric transformer.

A device for producing a non-thermal atmospheric pressure plasma is proposed, which comprises a piezoelectric transformer, a driver circuit which is designed to apply an input signal to the piezoelectric transformer, and a field probe which is configured to measure a field strength of an electric field produced by the piezoelectric transformer at a measurement point, preferably at at least two measurement points. The driver circuit is configured to adapt the input signal while taking into account the measurement results of the field probe.

By the measurement of the field strength at least two measurement points, a local field strength may be determined at different positions. The device may accordingly make it possible to measure a spatial profile of the electric field produced by the transformer. In particular, the device may make it possible to determine the position at which the field strength reaches its maximum. This position is crucial for the type of plasma ignition. If the maximum of the field strength lies at an output end side of the transformer or in front of the transformer, a plasma is ignited at the output end side. However, if the maximum of the field strength lies in the output region of the transformer and is at a distance from the output end side of the transformer, plasma ignitions take place along the edges of the output region. Plasma ignitions at the edges may lead to significant mechanical stresses on the transformer and to the formation of cracks. The cracks may destroy the transformer. The input signal applied to the transformer should therefore as far as possible be adapted in such a way that the maximum in the field strength is not formed in the output region of the transformer.

The device makes use of the high electric field strengths that are produced in the environment of the output region of the piezoelectric transformer. A measurement of this field strength may be carried out, without influencing the operation of the transformer, by direct load-side tapping of a power in the output region of the transformer. In particular, a measurement of the field strength may be carried out without thereby attenuating an oscillation of the piezoelectric transformer.

The field probe may be integrated into a housing of the device for producing a non-thermal atmospheric pressure plasma. The field probe may be arranged in the immediate vicinity of the piezoelectric transformer. For example, the distance between the piezoelectric transformer and the field probe may be less than 5 cm. Preferably, the distance between the piezoelectric transformer and the field probe may be less than 3 cm, particularly preferably less than 1.5 cm, or even less than 0.75 cm. A gap may remain between the field probe and the piezoelectric transformer. The gap should be wide enough to prevent plasma ignition between the field probe and the transformer.

The closer the field probe is arranged to the transformer, the better a spatial resolution of the parameters measured by the field probe can be. Depending on the existing environmental and operating conditions, however, the distance must not be selected to be too small so as to prevent electrical short circuits and discharges between the field probe and the transformer. In environments having relatively low air humidity, distances of 0.75 cm or 1.5 cm are sufficient to reliably prevent discharges. If there is a relatively high air humidity, however, a device that has a distance of from 1.5 cm to 3 cm between the field probe and the transformer should be used. In a similar way, other parameters, for example the process medium or the ignitability of the process medium, also influence the selection of the suitable distance.

The field probe is configured to determine a field strength with at least one measurement point. Preferably, the field probe is configured to determine the field strength at more than two measurement points. Particularly preferably, the number of measurement points may lie between 5 and 50, more particularly preferably between 8 and 30. The higher the number of measurement points is, the better a resolution of the measurement can be.

The driver circuit may be configured to adapt a frequency of the input signal while taking into account the measurement results of the field probe. In particular, the frequency of the input signal may be adjusted to the present series resonant frequency or the present parallel resonant frequency of the transformer. In this case, the present series resonant frequency and/or the present parallel resonant frequency may be determined from the measurement results of the field probe. The driver circuit may be configured to adapt the input signal while taking into account the measurement results of the field probe, in such a way that the frequency of the input signal corresponds to that of a series resonant frequency of the piezoelectric transformer or in such a way that the frequency of the input signal corresponds to that of a parallel resonant frequency of the piezoelectric transformer. This allows real-time regulation of the driver signal, or of the input signal. It consequently allows more efficient operation, less loss and lower mechanical stresses on the transformer. In this way, the energy requirement is reduced and the lifetime of the component increases.

As an alternative or in addition to the frequency, however, the driver circuit may also be configured to adapt further parameters of the input signal, for example the waveform, the power, the input voltage, the input current and/or the phase.

The driver circuit may be configured to adapt the input signal while taking into account the measurement results of the field probe, in such a way that a maximum in the field strength of the electric field produced by the piezoelectric transformer is formed at an output end side of the piezoelectric transformer or in a half-space, facing away from the piezoelectric transformer, in front of the output end side of the piezoelectric transformer. In this way, it is possible to avoid plasma ignitions along the edges of the output region, which could otherwise damage the transformer.

The field probe may comprise a substrate comprising an insulating material. The field probe may comprise metallizations that are separated from one another, which form the preferably at least two measurement points. The substrate may be a printed circuit board. The substrate may be single-layered or multilayered. The metallizations may, for example, be circular or rectangular. An alternating electric field produced by the piezoelectric transformer may produce an alternating voltage in the metallizations. The alternating voltage may be measured in order to determine the field strength.

The field probe may comprise a metal face, wherein the device is configured to determine the field strength at each measurement point by a measurement of a voltage between the metal face and the respective measurement point. A stable measurement signal may be obtained in this way. Local differences between the individual measurement points may in this case be readily identified. The metal face may form a frame. The metal face and the metallizations may be arranged on a lower side of the substrate, which faces away from the piezoelectric transformer, in order to avoid plasma ignitions against the metal face or the metallizations. As an alternative, the metallization may be arranged inside a multilayer substrate, wherein an insulating layer is arranged outward.

In addition, at least one passive component may be integrated into the substrate. As an alternative or in addition, at least one passive component and/or one active component may be arranged on a surface of the substrate. The driver circuit may be formed fully or partially by one or more passive components which are integrated into the substrate or are arranged on the surface of the substrate, and/or by one or more active components which are arranged on the surface of the substrate. Integration of the components into the substrate or arrangement of the components on the surface of the substrate may allow a compact design of the device. Such a compact design is advantageous in view of the usual requirements in relation to miniaturization.

The field probe may comprise at least three metallizations that are separated from one another, each of which forms a measurement point, wherein the at least three metallizations are arranged in a row. The field probe may be arranged in such a way that the row is arranged parallel to the piezoelectric transformer.

The device may furthermore comprise evaluation electronics for further processing of measurement values recorded by the field probe. The evaluation electronics may be connected to the driver circuit. The evaluation electronics may comprise a signal conditioner and a signal processing unit. The evaluation electronics may also be embodied fully or partially by means of a software solution, which also applies for the further processing of the signals and for the driver circuit, as well as the functions thereof.

The driver circuit may be configured to transmit the input signal applied to the piezoelectric transformer to the evaluation electronics, wherein the evaluation electronics are configured to determine the output signal determined by the piezoelectric transformer from the measurement values recorded by the field probe, and wherein the evaluation electronics are configured to compare the input signal with the output signal.

During the comparison of the input signal with the output signal, a voltage of the signals and/or a current of the signals and/or an impedance and/or a frequency of the signals and/or a phase of the signals may be considered. During the comparison of the input signal with the output signal, a parallel resonant frequency of the piezoelectric transformer and/or a series resonant frequency may be determined. The series resonant frequency is distinguished by a maximum field strength at the field probe, with at the same time a minimum current of the input signal. The series resonant frequency could therefore also be determined with the aid of a single measurement point. In order to determine the parallel resonant frequency, on the other hand, at least two, preferably a plurality of measurement points are required.

The evaluation electronics may be formed fully or partially by one or more passive components which are integrated into the substrate or are arranged on the surface of the substrate, and/or by one or more active components which are arranged on the surface of the substrate.

The evaluation electronics may be configured to detect a load arranged in front of the output end side of the piezoelectric transformer with the aid of a change in the field strength, wherein the driver circuit is configured in such a way that a power sufficient for the ignition of a non-thermal atmospheric pressure plasma is applied to the input region of the piezoelectric transformer only when a load is detected in front of the output end side. Furthermore, it may be possible to deliver the optimal power to the load and/or to adapt this power optimally.

Measurement of the field strength at a plurality of, at least two, different measurement points and comparison of the input signal with the output signal may make it possible to quantitatively and qualitatively detect a load arranged in front of the transformer. Since the load may have a significant influence on the electric field produced by the transformer, improved functioning of the transformer may be achieved by detecting the load and taking it into account in the driving of the transformer. If no load is detected, the power of the input signal may be adjusted to a lower value so that no plasma is ignited.

The device may furthermore comprise a second field probe, which is configured to measure a field strength of an electric field produced by the piezoelectric transformer at at least two measurement points. The transformer may, for example, be arranged between the two field probes. The second field probe may be of the same design as the first field probe, or it may have a different form than the first field probe.

In addition, the field probe may be combined with measuring instruments, for example for an air pressure, a temperature, a humidity, a conductivity, an ozone concentration, a gas composition, an ion concentration and/or a particle concentration.

In addition to the measurement values determined by the field probe, the driver circuit may furthermore be configured to take into account at least one of the following during the adaptation of the input signal: a pressure, a temperature, a humidity, a conductivity, an ozone concentration, a gas composition, an ion concentration and/or a particle concentration. In this case, the parameter determined by the field probe by means of the aforementioned measuring instrument may in particular be selected from a pressure, a temperature, a humidity, a conductivity, an ozone concentration, a gas composition, an ion concentration and/or a particle concentration.

The piezoelectric transformer may be configured to ignite a plasma at its output end side. The driver circuit may be configured to carry out a correction of the input signal at established time intervals during ongoing operation of the device while taking into account the measurement results of the field probe. As an alternative, this may be done continuously and/or in real time.

The device may be used to produce excited molecules, ions or radicals, in particular to produce OH radicals and/or nitrogen oxide and/or ozone.

A further aspect relates to a method for operating a piezoelectric transformer. This may be the piezoelectric transformer of the device described above. Accordingly, the structural and functional features which are described in connection with the device may also apply to the transformer.

The method may comprise the following steps:

application of an input signal to the piezoelectric transformer, measurement of the field strength of an electric field produced by the piezoelectric transformer by a field probe at a measurement point, preferably at least two measurement points, adaptation of the input signal applied to the piezoelectric transformer while taking into account the measurement values.

A frequency of the input signal may be varied stepwise, and the frequency at which a maximum in the field strength is set up at the output end side of the transformer or in a half-space, facing away from the piezoelectric transformer, in front of the output end side of the piezoelectric transformer, may be determined, wherein the frequency of the input signal is subsequently adjusted to the frequency determined.

The method may furthermore comprise the following steps:

transmission of the input signal to evaluation electronics, determination of an output signal of the piezoelectric transformer by the evaluation electronics from the measurement values recorded by the field probe, and comparison of the input signal with the output signal by the evaluation electronics.

These steps of the method may also be carried out fully or partially by means of software.

During the comparison of the input signal with the output signal, a parallel resonant frequency of the piezoelectric transformer may be determined and the frequency of the input signal is adjusted to the parallel resonant frequency. As an alternative, the series resonant frequency could be determined and the frequency of the input signal could be adjusted to the series resonant frequency.

In addition or as an alternative, the input signal may be adjusted, and/or adapted to certain operating states, with the aid of the measurement signals that have been read out from further measurement sensors and evaluated. In this case, the further measurement sensors may, for example, determine a pressure, a temperature and/or an ozone concentration.

The piezoelectric transformer may be used to produce a non-thermal atmospheric pressure plasma. The plasma may be used to produce excited molecules, ions or radicals.

A calibration of the piezoelectric transformer and/or a determination of ageing and/or a lifetime of the piezoelectric transformer, may be carried out by a comparison of the measurement values determined by the field probe with a reference signal.

BRIEF DESCRIPTION OF THE DRAWINGS

Preferred exemplary embodiments of the invention will be explained in more detail below with the aid of the figures.

FIG. 9 shows a first signal, which may be applied as an input signal to the piezoelectric transformer;

FIG. 10 shows measurement values determined by the field probe;

FIG. 11 shows a second input signal which may be applied to the piezoelectric transformer; and FIG. 12 respectively shows, for various signals applied to the piezoelectric transformer, the measurement values which are determined by the individual measurement points of the field probe for the field strength.

DETAILED DESCRIPTION OF ILLUSTRATIVE EMBODIMENTS

Figure 1:
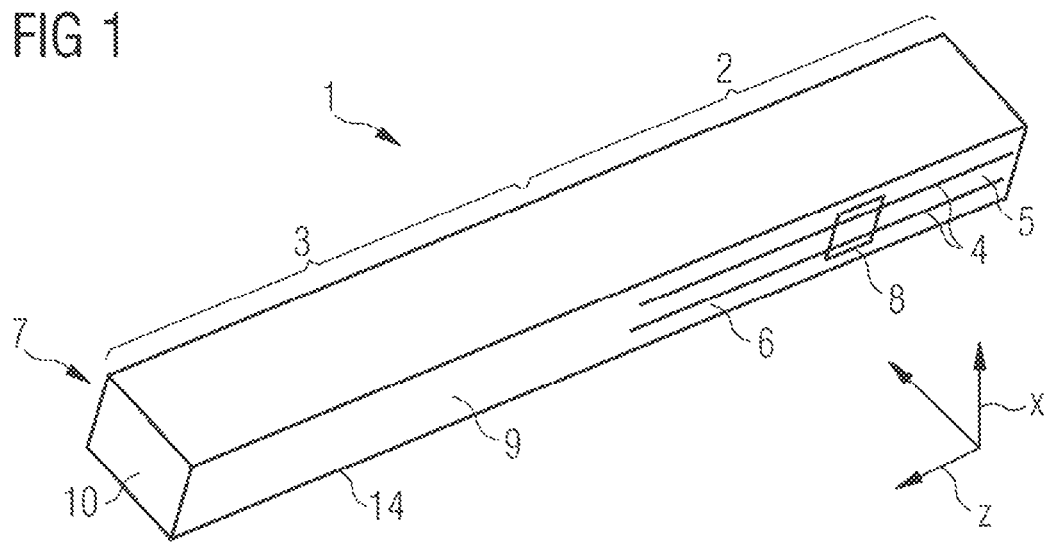
FIG. 1 shows a piezoelectric transformer in a perspective view.

FIG. 1 shows a piezoelectric transformer 1 in a perspective view. The piezoelectric transformer 1 may, in particular, be used in a plasma generator for producing non-thermal atmospheric pressure plasma.

A piezoelectric transformer 1 is a version of a resonant transformer which is based on piezoelectricity and, in contrast to conventional magnetic transformers, represents an electromagnetic system. The piezoelectric transformer 1 is, for example, a transformer of the Rosen type.

The piezoelectric transformer 1 comprises an input region 2 and an output region 3, wherein the output region 3 follows on from the input region 2 in a longitudinal direction z. In the input region 2, the piezoelectric transformer 1 comprises electrodes 4 to which an alternating voltage may be applied. The electrodes 4 extend in the longitudinal direction z of the piezoelectric transformer 1. The electrodes 4 are stacked alternately with a piezoelectric material 5 in a stack direction x, which is perpendicular to the longitudinal direction z. The piezoelectric material 5 is in this case polarized in the stack direction x.

The electrodes 4 are arranged inside the piezoelectric transformer 1, and are also referred to as internal electrodes. The piezoelectric transformer 1 comprises a first side face 6 and a second side face 7, which lies opposite the first side face 6. A first external electrode 8 is arranged on the first side face 6. A second external electrode (not shown) is arranged on the second side face 7. The internally lying electrodes 4 are electrically contacted alternately in the stack direction x with either the first external electrode 8 or the second external electrode.

The input region 2 may be driven with a low alternating voltage which is applied between the electrodes 4. Because of the piezoelectric effect, the alternating voltage applied on the input side is initially converted into a mechanical oscillation. The frequency of the mechanical oscillation is in this case substantially dependent on the geometry and the mechanical structure of the piezoelectric transformer 1.

The output region 3 comprises piezoelectric material 9 and is free of internally lying electrodes. The piezoelectric material 9 in the output region 3 is polarized in the longitudinal direction z. The piezoelectric material 9 of the output region 3 may be the same material as the piezoelectric material 5 of the input region 2, in which case the piezoelectric materials 5 and 9 may differ in their polarization direction. In the output region 3, the piezoelectric material 9 is formed as a single monolithic layer which is fully polarized in the longitudinal direction z. In this case, the piezoelectric material 9 in the output region 3 has only a single polarization direction.

If an alternating voltage is applied to the electrodes 4 in the input region 2, a mechanical wave is formed inside the piezoelectric material 5, 9 which produces an output voltage in the output region 3 by the piezoelectric effect. The output region 3 comprises an output end side 10. In the output region 3, an electrical voltage is therefore produced between the end side 10 and the end of the electrodes 4 of the input region 2. A high voltage is then produced at the output end side 10. A high potential difference is in this case also formed between the output end side and an environment of the piezoelectric transformer 1, this potential difference being sufficient to produce a strong electric field that ionizes a process gas.

In this way, the piezoelectric transformer 1 produces high electric fields that are capable of ionizing gases or liquids by electrical excitation. In this case, atoms or molecules of the respective gas, or of the respective liquid, are ionized and form a plasma. Ionization takes place whenever the electric field strength at the surface of the piezoelectric transformer 1 exceeds the ignition field strength of the plasma. The ignition field strength of a plasma in this case refers to the field strength which is required for ionization of the atoms or molecules.

Figure 2:
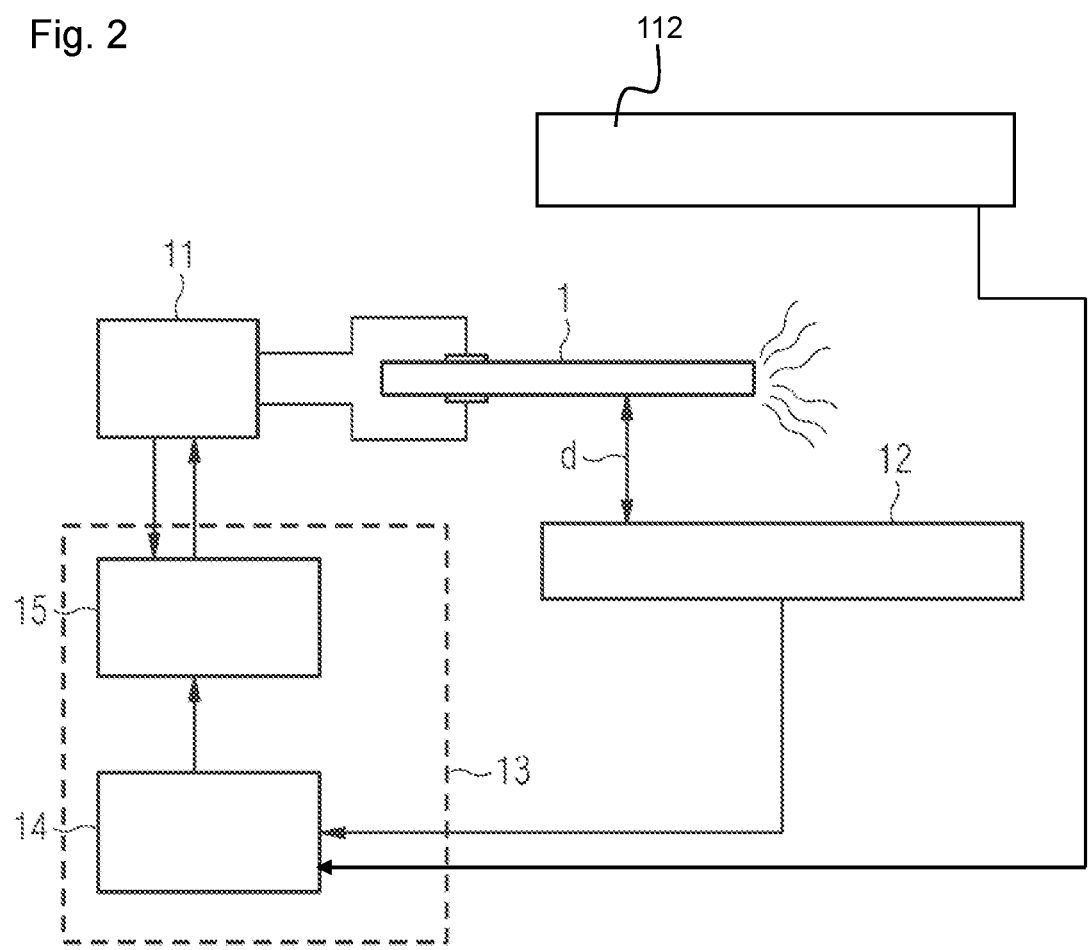
FIG. 2 shows a device for producing a non-thermal atmospheric pressure plasma.

FIG. 2 shows a device for producing a non-thermal atmospheric pressure plasma, which comprises the piezoelectric transformer 1 described in connection with FIG. 1. The device furthermore comprises a driver circuit 11 which is designed to apply an input signal to the piezoelectric transformer 1, a field probe 12 which measures a field produced by the piezoelectric transformer 1, and evaluation electronics 13 which are connected to the field probe 12 and to the driver circuit 11. The device may further comprise a second field probe 112.

It is an aim to make it possible to adapt the input signal constantly so that the piezoelectric transformer 1 is operated at its present series resonant frequency or at its present parallel resonant frequency. The series resonant frequency and the parallel resonant frequency of the transformer 1 are not constant but depend on various parameters. If a plasma is ignited at an output end side 10 of the transformer 1, it interacts as a load with the transformer 1 and then influences the impedance of the transformer 1. In this way, a shift of the series resonance and of the parallel resonant frequency takes place relative to operation of the transformer 1 under no load, during which the applied voltage is not sufficient to ignite a plasma. The working environments, for example the process gas used or the temperature of the transformer 1, also influence the series resonant frequency and the parallel resonant frequency.

The driver circuit 11 applies the input signal to the piezoelectric transformer 1. The input signal is preferably sinusoidal. However, input signals having a different waveform, for example rectangular or triangular, are also possible. The input signal that is produced by the driver circuit 11 is adapted continuously according to a feedback signal transmitted by the evaluation electronics 13 to the driver circuit 11.

The field probe 12 is configured to measure a field strength of the electric field produced by the piezoelectric transformer 1. The field probe 12 is arranged in the immediate vicinity of the output region 3 of the piezoelectric transformer 1. In particular, the field probe 12 is configured to determine the local field strength of the electric field produced by the piezoelectric transformer 1 at a plurality of measurement points. Accordingly, a spatial profile of the field strength of the electric field may be determined by the field probe 12. This may make it possible for the field probe 12 to determine the position at which a maximum field strength lies.

The configuration of the electric field and the position of the maximum field strength depend on the input signal applied to the transformer 1 and on the operating conditions of the piezoelectric transformer 1. In respect of the input signal, the following parameters are in this case crucial for the formation of the field: an input voltage, a current of an input current, a phase relationship between the input voltage and the input current, and a frequency of the input signal. In respect of the operating conditions, the electric field may be influenced by a process medium, an ambient temperature and/or an air humidity. Furthermore, a load arranged in the vicinity of the transformer 1 also influences the potential distribution of the electric field and therefore the position of the maximum field strength.

The evaluation electronics 13 are configured to evaluate the measurement values that have been determined by the field probe 12 and are furthermore configured to control the driver circuit 11. The evaluation electronics 13 comprise a signal conditioner 14 and a signal processing unit 15.

The field probe 12 transmits a measurement signal to the evaluation electronics 13. In the evaluation electronics 13, the measurement signal is initially processed by the signal conditioner 14. In particular, the signal conditioner 14 may filter the measurement signal, convert it into a digital signal, amplify it and/or equalize it. The signal processed further by the signal conditioner 14 is then forwarded to the signal processing unit 15. The signal processing unit 15 processes the signal and determines a feedback signal, which is transmitted to the driver circuit 11.

The signal processing unit 14 may in this case compare the input signal which is applied to the piezoelectric transformer 1 by the driver circuit 11 and an output signal of the transformer 1 with one another. To this end, the input signal applied to the piezoelectric transformer 1 by the driver circuit 11 may also be transmitted to the signal processing unit 14. The output signal of the transformer 1 is determined by the signal processing unit 14 with the aid of the measurement values recorded by the field probe 12. As an alternative, the output signal may also be compared with a reference signal in the signal processing unit 14. This may be used for calibrating the device and/or determining the degree of ageing of the piezoelectric transformer 1 and/or for lifetime monitoring of the piezoelectric transformer 1.

During the comparison of the input signal with the output signal, voltages of the two signals may be compared with one another. As an alternative or in addition, currents of the two signals may be compared with one another during the comparison of the input signal with the output signal. As an alternative or in addition, phase relationships between the voltages and the currents of the two signals may be compared with one another during the comparison of the input signal with the output signal. As an alternative or in addition, frequencies of the two signals may be compared with one another during the comparison of the input signal with the output signal. As an alternative or in addition, an impedance of the transformer may be taken into account during the comparison of the input signal with the output signal. By considering one or more of the parameters mentioned here during the comparison of the signals, the evaluation electronics 13 may determine the present parallel resonant frequency and/or the present series resonant frequency of the transformer 1. The evaluation electronics 13 then transmit a feedback signal to the driver circuit 11, which causes the driver circuit 11 to adapt the frequency of the input signal and adjust it to the present parallel resonant frequency or the present series resonant frequency of the transformer 1. This process may be repeated, at regular time intervals or continuously in real time, during ongoing operation of the device.

Figure 3:
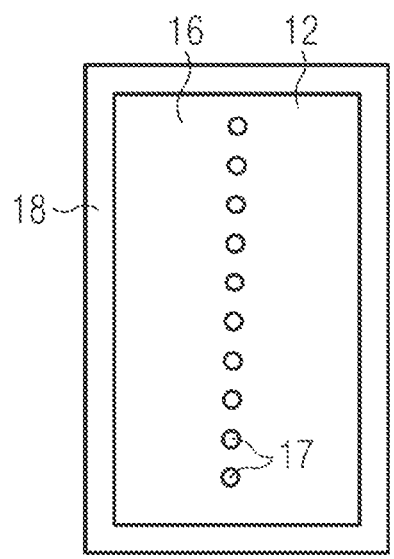
FIGS. 3, 4 and 5 respectively show a field probe according to a first exemplary embodiment.
Figure 4:
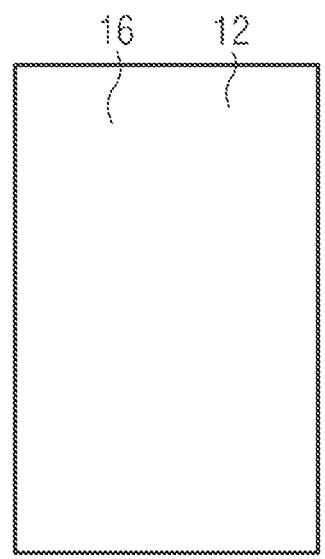
Figure 5:
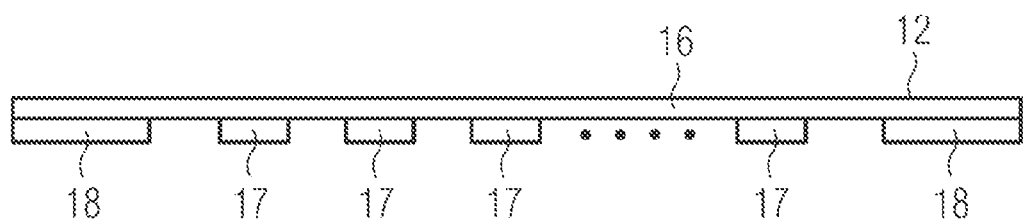

FIGS. 3, 4 and 5 respectively show a field probe 12 according to a first exemplary embodiment. FIG. 3 shows a lower side of the field probe 12, which faces away from the piezoelectric transformer 1. FIG. 4 shows an upper side of the field probe 12, which faces toward the piezoelectric transformer 1. FIG. 5 shows a cross section through the field probe 12.

The field probe 12 comprises a substrate 16 made of an insulating material. The insulating material may be a polymer, a ceramic material, FR4, glass or $Al_2O_3$, for example. According to the first exemplary embodiment, the substrate 16 is single-layered.

Metallizations 17 are formed on a lower side of the substrate 16, which faces away from the piezoelectric transformer 1. According to the first exemplary embodiment, the metallizations 17 are circular. Differently shaped metallizations 17, for example rectangular metallizations, are also conceivable. Each of the metallizations 17 forms a measurement point, at which the field probe 12 determines a local field strength of the electric field that is produced by the piezoelectric transformer 1. The measurement points are arranged in a row.

The field probe 12 is arranged at a distance d from the piezoelectric transformer 1, which is large enough to avoid plasma ignitions of the transformer 1 against the field probe 12. The distance d may furthermore be selected so that sparks of a plasma jet produced by the transformer 1 do not reach the field probe 12.

The field probe 12 is arranged parallel to the output region 3 of the piezoelectric transformer 1 and protrudes beyond the output region 3. The field probe 12 may accordingly measure the field strength in the output region 3 and in a half-space, facing away from the transformer 1, in front of the output end side 10 of the piezoelectric transformer 1.

The field probe 12 furthermore comprises a metal face 18, to which a reference potential is applied. The metal face 18 forms a frame and is arranged at the edges of the lower side of the field probe 12. The row formed by the measurement points is framed by the metal face 18. In order to determine a local field strength, the voltage between the respective measurement point and the metal face 18 is respectively determined. To this end, the metal face 18 is to be connected to the reference potential. Differently-shaped metal faces 18 are also conceivable. For example, instead of forming a circumferential frame, the metal face 18 could also be U- or Π-shaped.

Figure 6:
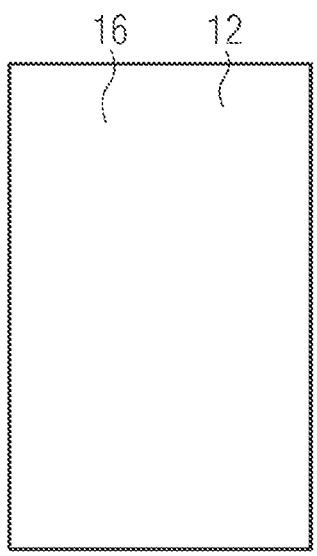
FIGS. 6, 7 and 8 show a field probe according to a second exemplary embodiment.
Figure 7:
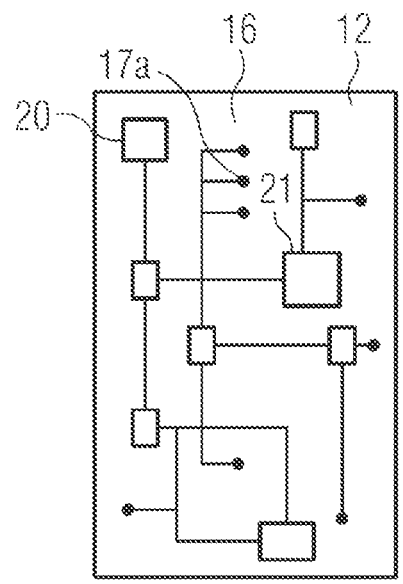
Figure 8:
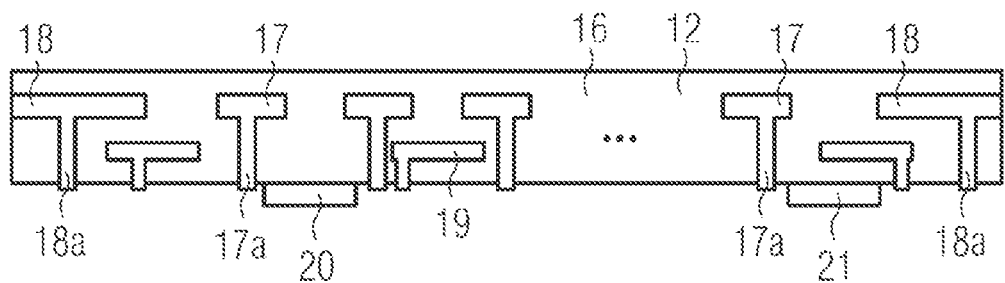

FIGS. 6, 7 and 8 show a field probe 12 according to a second exemplary embodiment. FIG. 6 shows an upper side of the field probe 12, which faces toward the piezoelectric transformer 1. FIG. 7 shows a lower side of the field probe 12, which faces away from the piezoelectric transformer 1. FIG. 8 shows a cross section through the field probe 12.

According to the second exemplary embodiment, the substrate 16 of the field probe 12 is multilayered. The metallizations 17 which form the measurement points are arranged in an inner layer of the substrate 16. The metallizations 17 furthermore comprise through-contacts 17*a*, which are fed through to the lower side of the field probe 12. The frame which is formed by the metal face 18 is also formed in the inner layer of the multilayer substrate 16 and comprises a through-contact 18*a*. A potential of the metal face 18 and of the metallizations 17 may be tapped at the through-contacts 17*a*, 18*a*.

Passive components 19 are furthermore integrated into the multilayer substrate 16 of the field probe 12. A further passive component 20 is arranged on the lower side of the field probe 12. Furthermore, an active component 21 is also arranged on the lower side of the field probe 12. The active and passive components 19, 20, 21 are components of the driver circuit 11 and/or of the evaluation electronics 13. In particular, the evaluation electronics 13 and/or the driver circuit 11 may respectively be formed fully or partially on the field probe 12.

FIG. 9 shows a first signal which may be applied as an input signal to the piezoelectric transformer 1 by the driver circuit 11. The signal is substantially sinusoidal.

FIG. 10 shows the measurement values determined by the field probe 12 for the field strength at various positions in the vicinity of the piezoelectric transformer 1. The field probe 12 is arranged in such a way that the measurement points are arranged parallel to the output region 3 and in a region in front of the output end side 10.

In FIG. 10, the field strength determined by the field probe 12 at the individual measurement points is respectively plotted in volts on the ordinate axis. The position of the measurement points is plotted on the abscissa axis, wherein the position o corresponds to the output end side 10. The output region 3 of the piezoelectric transformer 1 in this case extends in the positive direction. Accordingly, for example, the position "3 mm" is arranged in the output region 3 of the transformer 1 and lies at a distance of 3 mm from the output end side 10. The position "−3 mm" lies in front of the output end side 10 at a distance of 3 mm therefrom.

FIG. 10 shows the profile of the field strength for two different input signals, each of which has the substantially sinusoidal waveform shown in FIG. 9. The power of the first input signal is 10 W. The power of the second input signal is 5 W. It may be seen in FIG. 10 that, for the first input signal, a maximum of the electric field strength is formed at a distance of about 4 mm in front of the output end side 10. For the second input signal with a power of 5 W, on the other hand, a plateau of a maximum field strength, which extends from an edge region of the input region to a distance of about 6 mm in front of the output end side 10, is formed in the distribution of the electric field strength. This measurement therefore shows that the power of the input signal is crucial for the spatial arrangement of the maximum of the field strength.

FIG. 11 shows a second input signal which may be applied to the piezoelectric transformer 1 by the driver circuit 11. The second input signal has a periodic profile, but it does not form a regular sine curve.

FIG. 12 respectively shows, for various signals applied to the piezoelectric transformer 1, the measurement values which are determined by the individual measurement points of the field probe for the field strength. All the applied signals in this case have an input power of 5 W. Curves F1 and F2 correspond to an applied first signal, the profile of which is shown in FIG. 9, and curves L1, L2 and L3 correspond to an applied second signal, the profile of which is shown in FIG. 11.

FIG. 12 shows that, in the case of the second input signal, a maximum in the field strength which lies in the output region 3 of the piezoelectric transformer 1 at a distance of a few millimeters in front of the output end side is formed. Such a maximum is unfavorable since it may lead to plasma ignitions, by which the piezoelectric transformer 1 may be damaged, along the edges of the output region 3.

Operation of the transformer 1 with the second input signal is possible, but in this case the input signal should be adapted in such a way that the maximum of the field strength is shifted toward the output end side 10. To this end, for example, the frequency of the input signal may be adapted. A load arranged in front of the output end side 10 also leads to a variation of the field.

The field probe 12 therefore makes it possible to record the spatial profile of the electric field produced by the piezoelectric transformer 1, since the field probe 12 records the field strength at a plurality of measurement points simultaneously. In this way, as shown in connection with FIG. 12, the influence of different signal waveforms of the input signal on the potential profile of the field produced may be measured. With such a field probe 12, it is furthermore possible to measure the influence of different working conditions on the potential profile of the field produced, in which case the working conditions may for example differ in terms of temperature, air humidity or the process medium used. With such a field probe 12, it is furthermore possible to demonstrate the effect of ageing of the transformer 1, in which case variations of the electric field over the lifetime of the transformer 1 may be measured.

Evaluation of the measurement values recorded by the field probe 12 makes it possible to obtain quantitative and qualitative information about a load arranged in front of the transformer 1. In particular, the evaluation electronics 13 may be configured to determine whether a load is arranged in front of the piezoelectric transformer 1 with the aid of the measurement values recorded by the field probe 12 and the comparison of the input signal with the output signal. If no load is detected, the evaluation electronics 13 may send a feedback signal to the driver circuit 11, according to which signal the power of the input signal is reduced to such an extent that plasma ignitions do not take place. If a load is detected, the evaluation electronics 13 may send a feedback signal to the driver circuit 11, according a power of the input signal which is sufficient for the ignition of plasma is adjusted. Accordingly, the plasma may be ignited only when a load arranged in front of the transformer 1 is detected.

The field probe 12 may be integrated into a holder in which the piezoelectric transformer 1 is mechanically fastened and via which the piezoelectric transformer 1 is electrically contracted.

The invention claimed is:

1. A device comprising:
a piezoelectric transformer;
a driver circuit configured to apply an input signal to the piezoelectric transformer;
evaluation electronics connected to the driver circuit; and
a field probe comprising a metallization forming a measurement point, at which the field probe is configured to determine a local field strength of an electric field produced by the piezoelectric transformer,
wherein the field probe is configured to measure the field strength of the electric field at the measurement point,
wherein the driver circuit is configured to:
adapt the input signal while taking into account measurement results of the field probe, and
transmit the input signal applied to the piezoelectric transformer to the evaluation electronics,
wherein the evaluation electronics are configured to:
further process measurement values recorded by the field probe,
determine an output signal determined by the piezoelectric transformer from the measurement values recorded by the field probe, and
compare the input signal with the output signal, and
wherein the device is configured to produce a non-thermal atmospheric pressure plasma.

2. The device according to claim 1, wherein the field probe is configured to measure a field strength of the electric field at at least two measurement points.

3. The device according to claim 1, wherein the driver circuit is configured to adapt a frequency of the input signal while taking into account the measurement results of the field probe.

4. The device according to claim 1, wherein the driver circuit is configured to adapt at least one of a voltage of the input signal, a current of the input signal, a phase of the input signal or a signal waveform of the input signal while taking into account the measurement results of the field probe.

5. The device according to claim 1, wherein the driver circuit is configured to adapt the input signal while taking into account the measurement results of the field probe, in such a way that a frequency of the input signal corresponds to that of a series resonant frequency of the piezoelectric transformer or in such a way that the frequency of the input signal corresponds to that of a parallel resonant frequency of the piezoelectric transformer.

6. The device according to claim 1, wherein the driver circuit is configured to adapt the input signal while taking into account the measurement results of the field probe, in such a way that a maximum in the field strength of the electric field is formed at an output end side of the piezoelectric transformer or in a half-space, facing away from the piezoelectric transformer, in front of the output end side of the piezoelectric transformer.

7. The device according to claim 1, wherein the field probe comprises a substrate comprising an insulating material, and wherein the field probe comprises metallizations separated from one another, which form at least two measurement points.

8. The device according to claim 7, wherein the field probe comprises a metal face, and wherein the device is configured to determine the field strength at each measurement point by a measurement of a voltage between the metal face and the respective measurement point.

9. The device according to claim 7, wherein at least one passive component is integrated into the substrate.

10. The device according to claim 9, wherein the driver circuit is formed fully or partially by at least one of one or more passive component integrated into the substrate or arranged on a surface of the substrate, or one or more active components arranged on the surface of the substrate.

11. The device according to claim 7, wherein at least one of a passive component or an active component are arranged on a surface of the substrate.

12. The device according to claim 1, wherein the field probe comprises at least three metallizations separated from one another, each of which forms a measurement point, and wherein the at least three metallizations are arranged in a row.

13. The device according to claim 12, wherein the field probe is arranged in such a way that the row is arranged parallel to the piezoelectric transformer.

14. The device according to claim 1, wherein, during comparison of the input signal with the output signal, at least one of a voltage of the signals, a current of the signals, an impedance of the signals, a frequency of the signals or a phase of the signals is considered.

15. The device according to claim 1, wherein, during comparison of the input signal with the output signal, at least one of a parallel resonant frequency or a series resonant frequency of the piezoelectric transformer are determined.

16. The device according to claim 1, wherein the evaluation electronics are formed fully or partially by at least one of one or more passive components integrated into a substrate or arranged on a surface of the substrate, and/or by or one or more active components arranged on the surface of the substrate.

17. The device according to claim 1,
wherein the evaluation electronics are configured to detect a load arranged in front of an output end side of the piezoelectric transformer with aid of a change in the field strength, and
wherein the driver circuit is configured so that a power sufficient for an ignition of the non-thermal atmospheric pressure plasma is applied to an input region of the piezoelectric transformer only when the load is detected in front of the output end side.

18. The device according to claim 1, wherein the evaluation electronics are embodied fully or partially by software.

19. The device according to claim 1, wherein the driver circuit is embodied fully or partially by software.

20. The device according to claim 1, further comprising a second field probe configured to measure a field strength of an electric field at least two measurement points.

21. The device according to claim 1, wherein the piezoelectric transformer is configured to ignite a plasma at its output end side.

22. The device according to claim 1, wherein the field probe is configured to measure at least one of the following: a pressure, a temperature, a humidity, a conductivity, an ozone concentration, a gas composition, an ion concentration and/or or a particle concentration.

23. The device according to claim 1, wherein the driver circuit is configured to take into account at least one of the following during adaptation of the input signal: a pressure, a temperature, a humidity, a conductivity, an ozone concentration, a gas composition, an ion concentration or a particle concentration.

24. The device according to claim 1, wherein the driver circuit is configured to carry out a correction of the input signal at established time intervals during ongoing operation of the device while taking into account the measurement results of the field probe.

25. The device according to claim 1, wherein the adaptation of the input signal is carried out continuously or in real time.

26. The device according to claim 1, wherein the device is configured to produce at least one of excited molecules, ions or radicals, OH radicals, nitrogen oxide, or ozone.

27. A method for operating a piezoelectric transformer, the method comprising:
applying, by a driver circuit, an input signal to the piezoelectric transformer;
measuring a field strength of an electric field produced by the piezoelectric transformer by a field probe at a measurement point;
adopting the input signal applied to the piezoelectric transformer while taking into account measurement values;
transmitting the input signal to evaluation electronics;
determining, by the evaluation electronics, an output signal of the piezoelectric transformer from measurement values recorded by the field probe; and
comparing, by the evaluation electronics, the input signal with the output signal.

28. The method according to claim 27, wherein measuring the field strength of the electric field by the field probe comprising measuring the field strength at at least two measurement points.

29. The method according to claim 27, further comprising:
stepwise varying a frequency of the input signal;
determining the frequency at a maximum field strength at an output end side of the transformer or in a half-space, facing away from the piezoelectric transformer, in front of the output end side of the piezoelectric transformer; and
subsequently adjusting the frequency of the input signal to the determined frequency.

30. The method according to claim 27, wherein, while comparing the input signal with the output signal, determining a parallel resonant frequency of the piezoelectric transformer and adjusting the frequency of the input signal to the parallel resonant frequency.

31. The method according to claim 27, further comprising using the piezoelectric transformer to produce a non-thermal atmospheric pressure plasma.

32. The method according to claim 31, wherein the plasma is used to produce excited molecules, ions or radicals.

33. The method according to claim 27, further comprising performing a calibration of the piezoelectric transformer by comparing the measurement values determined by the field probe with a reference signal.

34. The method according to claim 27, further comprising determining at least one of an ageing or a lifetime of the piezoelectric transformer by comparing the measurement values determined by the field probe with a reference signal.

35. A device comprising:
a piezoelectric transformer;
a driver circuit configured to apply an input signal to the piezoelectric transformer;
evaluation electronics connected to the driver circuit; and
a field probe comprising a metallization forming a measurement point, at which the field probe is configured to determine a local field strength of an electric field produced by the piezoelectric transformer,
wherein the field probe is configured to measure the field strength of the electric field at the measurement point, wherein the driver circuit is configured to adapt the input signal while taking into account measurement results of the field probe, wherein the driver circuit is configured so that a power sufficient for an ignition of a nonthermal atmospheric pressure plasma is applied to an input region of the piezoelectric transformer only when a load is detected in front of a output end side, wherein the evaluation electronics are configured to:
further process measurement values recorded by the field probe, and
detect the load arranged in front of the output end side of the piezoelectric transformer with aid of a change in the field strength, and wherein the device is configured to produce the nonthermal atmospheric pressure plasma.

36. A method for operating a piezoelectric transformer, the method comprising:
applying, by a driver circuit, an input signal to the piezoelectric transformer;
measuring a field strength of an electric field produced by the piezoelectric transformer by a field probe at a measurement point;
adopting the input signal applied to the piezoelectric transformer while taking into account measurement values; and
transmitting the input signal to evaluation electronics,
wherein the evaluation electronics detects a load arranged in front of an output end side of the piezoelectric transformer with aid of a change in the field strength, and
wherein the driver circuit is configured so that a power sufficient for an ignition of a nonthermal atmospheric pressure plasma is applied to an input region of the piezoelectric transformer only when the load is detected in front of the output end side.

37. A device comprising:
a piezoelectric transformer;
a driver circuit configured to apply an input signal to the piezoelectric transformer; and
a field probe comprising a metallization forming a measurement point, at which the field probe is configured to determine a local field strength of an electric field produced by the piezoelectric transformer,
wherein the field probe is configured to measure the field strength of the electric field at the measurement point,
wherein the driver circuit is configured to adapt the input signal while taking into account measurement results of the field probe, and
wherein the device is configured to:
produce a nonthermal atmospheric pressure plasma, and
perform a calibration of the piezoelectric transformer by comparing the measurement values determined by the field probe with a reference signal.

38. A method for operating a piezoelectric transformer, the method comprising:
applying, by a driver circuit, an input signal to the piezoelectric transformer;
measuring a field strength of an electric field produced by the piezoelectric transformer by a field probe at a measurement point;
adopting the input signal applied to the piezoelectric transformer while taking into account measurement values; and performing a calibration of the piezoelectric transformer by comparing the measurement values determined by the field probe with a reference signal.

39. A device comprising:
a piezoelectric transformer;
a driver circuit configured to apply an input signal to the piezoelectric transformer; and
a field probe comprising a metallization forming a measurement point, at which the field probe is configured to determine a local field strength of an electric field produced by the piezoelectric transformer,
wherein the field probe is configured to measure the field strength of the electric field at the measurement point,
wherein the driver circuit is configured to adapt the input signal while taking into account measurement results of the field probe, and
wherein the device is configured to:
produce a nonthermal atmospheric pressure plasma, and
determine at least one of ageing and a lifetime of the piezoelectric transformer by comparing the measurement values determined by the field probe with a reference signal.

40. A method for operating a piezoelectric transformer, the method comprising:
applying, by a driver circuit, an input signal to the piezoelectric transformer;
measuring a field strength of an electric field produced by the piezoelectric transformer by a field probe at a measurement point;
adopting the input signal applied to the piezoelectric transformer while taking into account measurement values; and
determining at least one of ageing or a lifetime of the piezoelectric transformer by comparing the measurement values determined by the field probe with a reference signal.

41. A device comprising:
a piezoelectric transformer;
a driver circuit configured to apply an input signal to the piezoelectric transformer; and
a field probe comprising a metallization forming a measurement point, at which the field probe is configured to determine a local field strength of an electric field produced by the piezoelectric transformer,
wherein the field probe is configured to measure the field strength of the electric field at the measurement point,
wherein the driver circuit is configured to adapt the input signal while taking into account the measurement results of the field probe in such a way that a frequency of the input signal corresponds to that of a parallel resonant frequency of the piezoelectric transformer, and
wherein the device is configured to produce a nonthermal atmospheric pressure plasma.

42. A method for operating a piezoelectric transformer, the method comprising:
applying, by a driver circuit, an input signal to the piezoelectric transformer;
measuring a field strength of an electric field produced by the piezoelectric transformer by a field probe at a measurement point;
adopting the input signal applied to the piezoelectric transformer while taking into account measurement values; and determining a parallel resonant frequency of the piezoelectric transformer and adjusting the frequency of the input signal to the parallel resonant frequency.

43. A device comprising:

a piezoelectric transformer;

a driver circuit configured to apply an input signal to the piezoelectric transformer; and a field probe comprising a metallization forming a measurement point, at which the field probe is configured to determine a local field strength of an electric field produced by the piezoelectric transformer, wherein the field probe is configured to:

measure the field strength of the electric field produced at the measurement point, and measure at least one of the following: a pressure, a temperature, a humidity, a conductivity, an ozone concentration, a gas composition, an ion concentration or a particle concentration, wherein the driver circuit is configured to:

adapt the input signal while taking into account measurement results of the field probe, and take into account at least one of the following during adaptation of the input signal: the pressure, the temperature, the humidity, the conductivity, the ozone concentration, the gas composition, the ion concentration or the particle concentration, and wherein the device is configured to produce a nonthermal atmospheric pressure plasma.

44. A method for operating a piezoelectric transformer, the method comprising:

applying an input signal by a driver circuit to the piezoelectric transformer;

measuring a field strength of an electric field produced by the piezoelectric transformer by a field probe at a measurement point;

adopting the input signal applied to the piezoelectric transformer while taking into account measurement values; and measuring, by the field probe, at least one of the following: a pressure, a temperature, a humidity, a conductivity, an ozone concentration, a gas composition, an ion concentration or a particle concentration; and taking into account, by the drive circuit, at least one of the following during adaptation of the input signal: the pressure, the temperature, the humidity, the conductivity, the ozone concentration, the gas composition, the ion concentration or the particle concentration.

* * * * *

UNITED STATES PATENT AND TRADEMARK OFFICE
CERTIFICATE OF CORRECTION

| | | |
|---|---|---|
| PATENT NO. | : 11,903,321 B2 | |
| APPLICATION NO. | : 16/976643 | |
| DATED | : February 13, 2024 | |
| INVENTOR(S) | : Goran Miskovic | |

It is certified that error appears in the above-identified patent and that said Letters Patent is hereby corrected as shown below:

In the Claims

In Column 13, in Claim 16, Line 29, after "substrate" delete ", and/or by".

In Column 13, in Claim 22, Line 56, delete "and/or or" and insert -- or --.

Signed and Sealed this
Thirtieth Day of April, 2024

Katherine Kelly Vidal
*Director of the United States Patent and Trademark Office*